(12) United States Patent
Hsiao

(10) Patent No.: US 8,567,883 B2
(45) Date of Patent: Oct. 29, 2013

(54) RACK MECHANISM FOR SERVER

(75) Inventor: Sheng-Chung Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 47 days.

(21) Appl. No.: 13/326,208

(22) Filed: Dec. 14, 2011

(65) Prior Publication Data

US 2013/0049558 A1 Feb. 28, 2013

(30) Foreign Application Priority Data

Aug. 30, 2011 (TW) .............................. 100131171 A

(51) Int. Cl.
*A47B 97/00* (2006.01)

(52) U.S. Cl.
USPC ................... 312/249.8; 312/201; 312/334.28

(58) Field of Classification Search
USPC ............... 312/249.1, 249.8, 249.9, 198, 201, 312/334.24–334.28
See application file for complete search history.

(56) References Cited

U.S. PATENT DOCUMENTS

| | | | | |
|---|---|---|---|---|
| 4,615,449 A * | 10/1986 | Naito et al. | | 211/162 |
| 5,205,627 A * | 4/1993 | Davison et al. | | 312/201 |
| 5,967,346 A * | 10/1999 | Price, Jr. | | 211/162 |
| 6,231,138 B1 * | 5/2001 | Janson | | 312/201 |
| 6,416,143 B1 * | 7/2002 | Janson | | 312/201 |
| 6,471,309 B1 * | 10/2002 | Turner | | 312/201 |
| 6,526,702 B2 * | 3/2003 | Jones | | 52/64 |
| 6,688,708 B1 * | 2/2004 | Janson | | 312/200 |
| 7,475,955 B2 * | 1/2009 | Dressendorfer et al. | | 312/334.26 |
| 8,371,666 B2 * | 2/2013 | Wu | | 312/334.28 |
| 2003/0094884 A1 * | 5/2003 | Sobol | | 312/201 |
| 2012/0104918 A1 * | 5/2012 | Peng et al. | | 312/334.27 |

* cited by examiner

*Primary Examiner* — Hanh V Tran

(74) *Attorney, Agent, or Firm* — Altis & Wispro Law Group, Inc.

(57) ABSTRACT

A rack mechanism includes a sliding rail, a cabinet, three first fixed beams, a guide rail, two rods, and four roller assemblies. The cabinet includes a top portion, which includes a lid defining four holes. The bottom portion slidably connected to the sliding rail. The three first fixed beams parallelly arranged above the top portion. The guide rail is fixed to the first fixed beams. The two rods are arranged under the lid. Each two of the four roller assemblies are respectively connected to the two rods. Each roller assembly includes a shelf and a pulley. One end of the shelf passes through one of the holes to fix the shelf to the rod. The pulley is arranged to the other end of the shelf. The pulley rolls along the guide rails when the bottom portion slides along the sliding rails.

8 Claims, 3 Drawing Sheets

RACK MECHANISM FOR SERVER

BACKGROUND

1. Technical Field

The present disclosure relates to a rack mechanism for server.

2. Description of Related Art

A rack mechanism includes a number of aligned sliding rails to place a number of servers. However, when the server slides along the sliding rails, the top of the server can easily topple.

BRIEF DESCRIPTION OF THE DRAWINGS

The components of the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
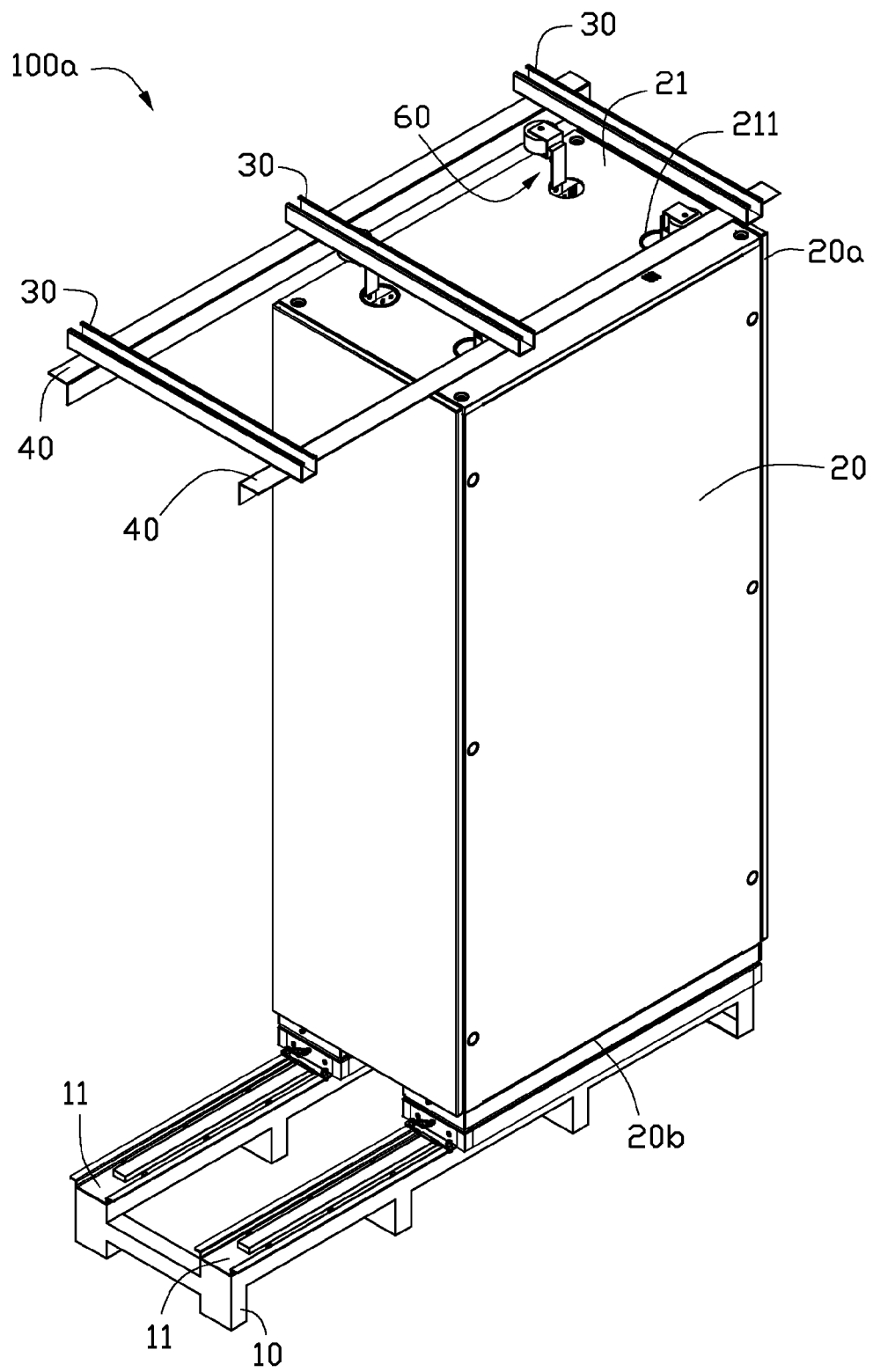
FIG. 1 is an isometric view of a rack mechanism in accordance with a first exemplary embodiment.
Figure 2:
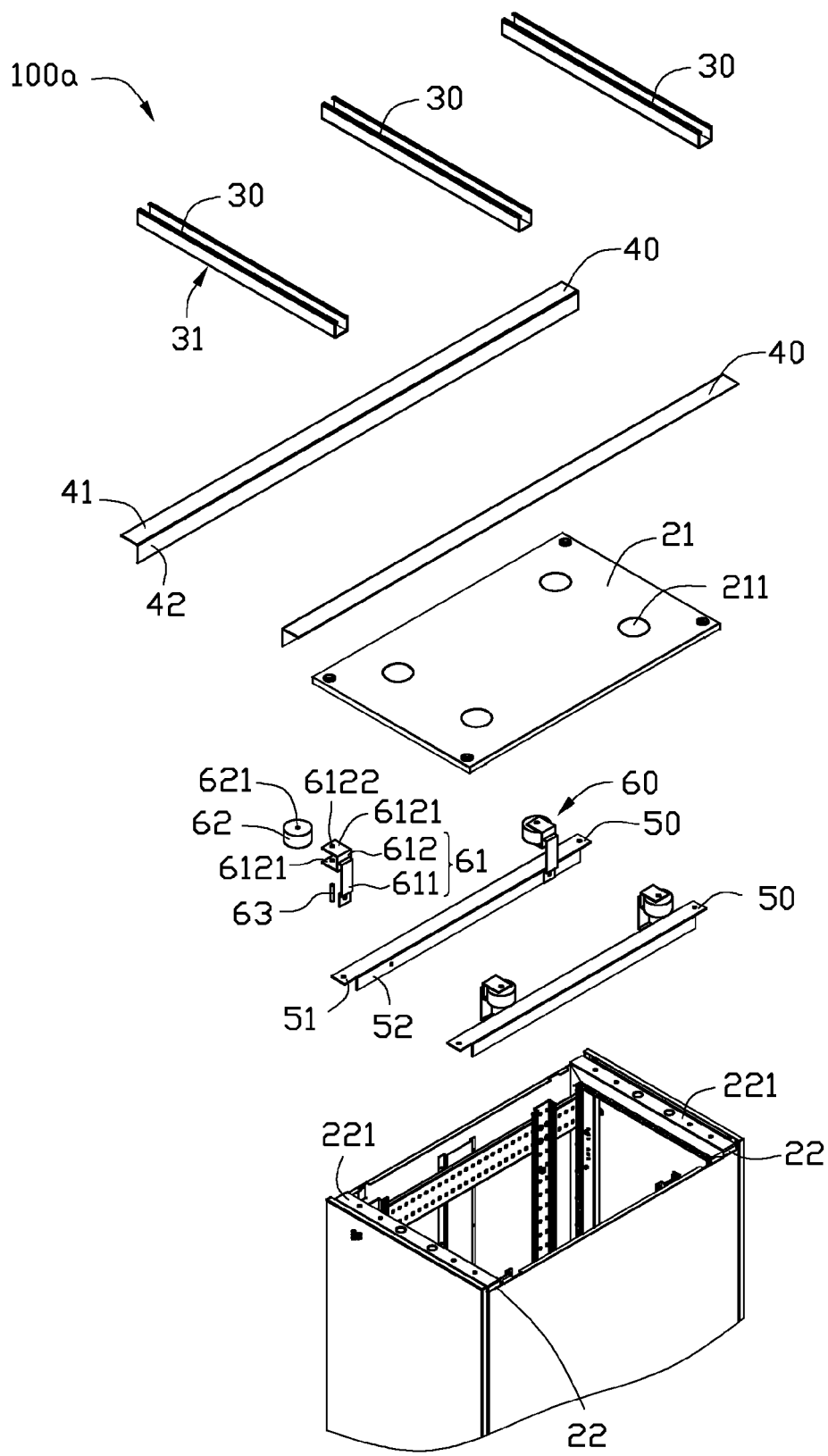
FIG. 2 is an exploded view of the rack mechanism of FIG. 1.

FIGS. 1-2, shows a rack mechanism 100a of a first embodiment including a sliding rail 10, a cabinet 20, three first fixed beams 30, two guide rails 40, two rods 50, and four roller assemblies 60. In this embodiment, the sliding rail 10 includes two sliding tracks 11. The cabinet 20 includes a top portion 20a and a bottom portion 20b away from the top portion 20a. The bottom portion 20b slidably connects to the two sliding tracks 11.

The top portion 20a includes a lid 21. The lid 21 defines four holes 211. In this embodiment, the lid 21 is rectangular cuboid-shaped. Each of the four holes 211 are respectively defined near each of four corners of the lid 21. The top portion 20a further includes two parallel second fixed beams 22, which are arranged in the cabinet 20 and near the lid 21. Each of the two second fixed beams 22 includes a top surface 221 opposite to the lid 21.

The three first fixed beams 30 are parallelly arranged above the top portion 20a. Each of the first fixed beams 30 includes a first surface 31 opposite to the cabinet 20. The two guide rails 40 are perpendicular to the first fixed beams 30. The two guide rails 40 are fixed on the first surface 31 of the first fixed beams 30 and are positioned between the cabinet 20 and the first fixed beams 30. The guide rail 40 is L-shaped and includes a first board 41 contacting the first surface 31 and a second board 42 perpendicular to the first board 41.

The two rods 50 are fixed inside the cabinet 20 and are arranged under the lid 21. The rod 50 is L-shaped and includes a second surface 51, which is arranged parallelly to the lid 21 and a third surface 53, which is perpendicular to the second surface 52. The two rods 50 are respectively perpendicularly connected to the second fixed beams 22. The second surface 51 of each rod 50 contacts the top surface 221 of the second fixed beams 22.

Each two of the four roller assemblies 60 are respectively connected to the two rods 50. The roller assembly 60 includes a shelf 61, a pulley 62, and an axis 63. The shelf 61 includes a first end 611 and a second end 612 away from the first end 611. The shelf 61 passes through one of the four holes 211 defined on the lid 21 with the first end 611 of the shelf 61 being fixed to the third surface 52 of the rod 50. The second end 612 includes two panels 6121 parallel to the second surface 51 of the rod 50. The two panels 6121 respectively define an axis hole 6122. The pulley 62 is cylinder-shaped. The pulley 62 defines a second axis hole 621 along the centre axis of the cylinder. The axis 63 passes through the second axis hole 621 to make the two ends of the axis 63 be respectively fixed to the first axis hole 6122. Thus, the pulley 62 is arranged between the two panels 6121 and is capable of rolling about the axis 63.

When the rack mechanism 100a is used, the cabinet 20 slides along the sliding track 11, and the pulley 62 rotates around the axis 63 and rolls along the second board 42 of the guide rail 40 to guide the top portion 20a to slide along the guide rail 40.

Figure 3:
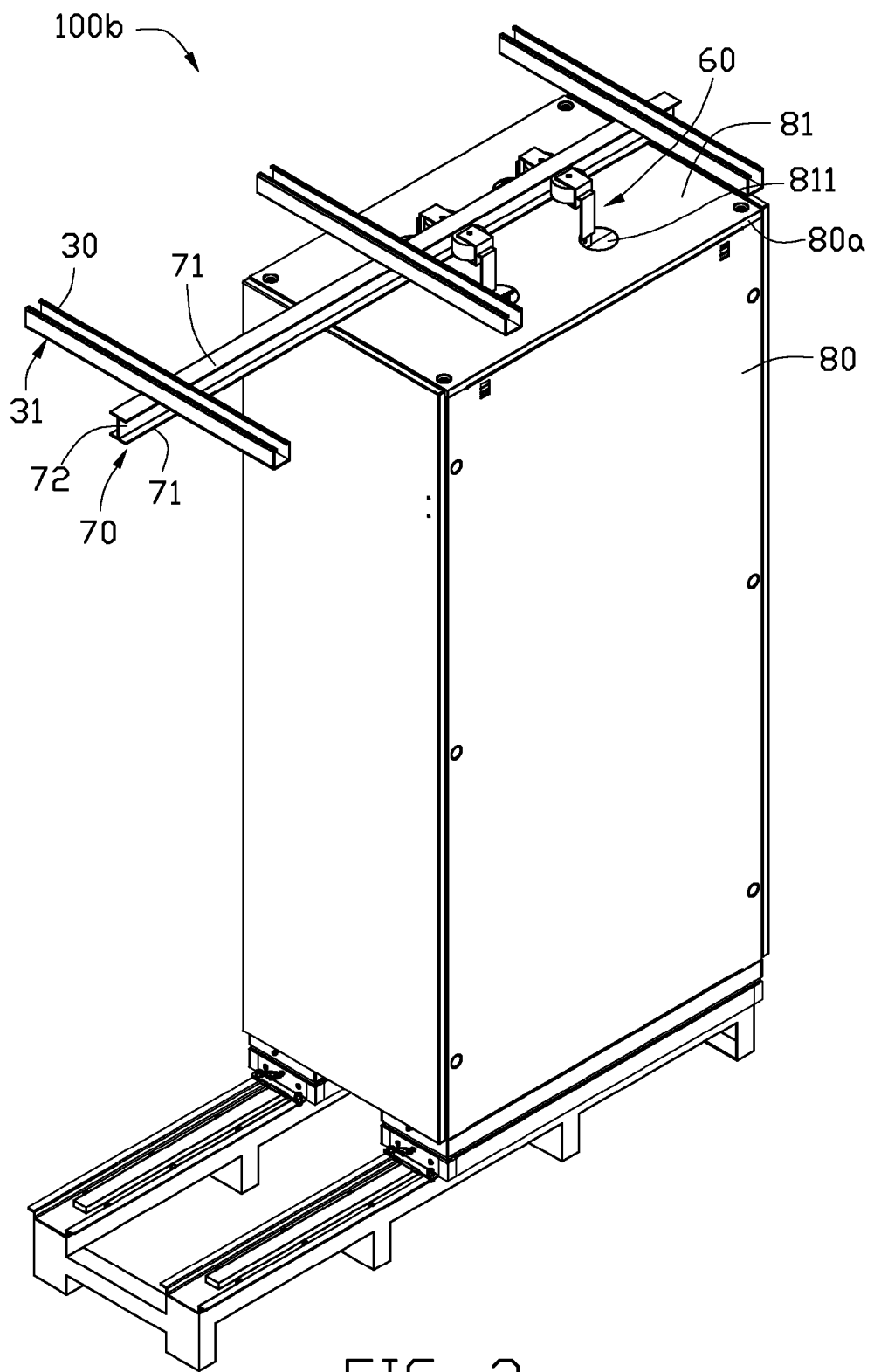
FIG. 3 is an isometric view of a rack mechanism in accordance with a second exemplary embodiment.

FIG. 3 is an isometric view of a rack mechanism 100b in accordance with a second exemplary embodiment. The structure of the rack mechanism 100b is similar to that of the rack mechanism 100a. The rack mechanism 100b includes a guide rail 70 instead of the guide rail 40, a cabinet 80 instead of the cabinet 20, a top portion 80a instead of the top portion 20a, and a lid 81 instead of the lid 20. The guide rail 70, being I-shaped, includes two third boards 70 which are parallel to the first surface 31 of the first fixed beams 30 and a fourth board 72 perpendicularly connected between the two third boards 71. The third board 70 is fixed to the first surface 31 of the first fixed beams 30. The pulley 62 rolls along the fourth board 72 to guide the top portion 80a of the cabinet 80. The lid 81 defines four holes 811. The position of the four holes 811 on the lid 80 are determined by the position where the four roller assemblies 60 are fixed to the lid 80.

In other embodiment, the number of the roller assemblies 60 is not limited to four, only two or more than four roller assemblies 60 can be designed for the rack mechanism 100a/100b.

Although, the present disclosure has been specifically described on the basis of preferred embodiments, the disclosure is not to be construed as being limited thereto. Various changes or modifications may be made to the embodiment without departing from the scope and spirit of the disclosure.

What is claimed is:

1. A rack mechanism for placing server, comprising:
   a sliding rail;
   a cabinet comprising:
      a top portion comprising a lid defining at least two holes; and
      a bottom portion slidably connected to the sliding rail;
   at least two first fixed beams parallelly arranged above the top portion;
   at least one guide rail fixed to the at least two first fixed beams and positioned between the cabinet and the at least two first fixed beams;
   two rods fixed inside the cabinet and arranged under the lid; and
   at least two roller assemblies, wherein the at least two roller assemblies are respectively connected to the two rods, each of the at least two roller assemblies comprises a shelf and a pulley, the shelf comprises a first end and a second end, the shelf passes through one of the at least two holes defined on the lid with the first end of the shelf being fixed to the rod, the pulley is arranged to the second end;
   wherein when the bottom portion slides along the sliding rail, the pulley rolls along the at least one guide rail.

2. The rack mechanism as described in claim 1, wherein the number of the at least one guide rail is two, the two guide rails are L-shaped, and perpendicular to the at least two first fixed beams.

3. The rack mechanism as described in claim 1, wherein the number of the at least one guide rail is one, the guide rail is I-shaped and perpendicular to the at least two first fixed beams.

4. The rack mechanism as described in claim 1, wherein the number of the at least two roller assemblies is four, correspondingly, the number of the at least two holes defined on the lid is four.

5. The rack mechanism as described in claim 1, wherein the top portion further includes two parallel second fixed beams arranged in the cabinet and near the lid, each of the two second fixed beams includes a top surface being opposite to the lid, the two rods are respectively perpendicularly connected to the second fixed beams.

6. The rack mechanism as described in claim 1, wherein each of the at least two roller assemblies further comprises an axis, the second end further comprises two parallel panels, the two panels respectively define an axis hole, the pulley defines a second axis hole along the centre axis of the pulley, the axis passes through the second axis hole to make the two ends of the axis be respectively fixed to the first axis hole.

7. The rack mechanism as described in claim 1, wherein the pulley of each of the at least two roller assemblies is cylinder-shaped.

8. The rack mechanism as described in claim 1, wherein the sliding rail comprises two sliding tracks the bottom portion slidably connects to the two sliding tracks.

* * * * *